United States Patent [19]

Delorme et al.

[11] Patent Number: 5,748,660
[45] Date of Patent: May 5, 1998

[54] SAMPLE GRATING DISTRIBUTED BRAGG REFLECTOR LASER, VERY WIDELY MATCHABLE BY PHASE VARIATION AND PROCESS FOR USING THIS LASER

[75] Inventors: Franck Delorme, Villejuif; Christophe Ougier, Paris, both of France

[73] Assignee: France Telecom, Paris, France

[21] Appl. No.: 679,120

[22] Filed: Jul. 12, 1996

[30]  Foreign Application Priority Data

Jul. 25, 1995 [FR] France ................... 95 09004

[51] Int. Cl.$^6$ ................... H01S 3/19; H01S 3/10; H01S 3/08
[52] U.S. Cl. ................... 372/50; 372/20; 372/96
[58] Field of Search ................... 372/96, 20, 46, 372/50, 102, 29, 32, 28

[56]  References Cited

U.S. PATENT DOCUMENTS

| | | | |
|---|---|---|---|
| 5,321,716 | 6/1994 | Kinoshita et al. | 372/96 |
| 5,325,392 | 6/1994 | Tohmori et al. | 372/50 |
| 5,357,538 | 10/1994 | Talneau et al. | 372/96 |
| 5,379,318 | 1/1995 | Weber . | |

FOREIGN PATENT DOCUMENTS

| | | |
|---|---|---|
| 0 477 987 | 4/1992 | European Pat. Off. . |
| 0 559 192 | 9/1993 | European Pat. Off. . |
| 0 692 853 | 1/1996 | European Pat. Off. . |

OTHER PUBLICATIONS

Tohmori et al, "Broad–Range Wavelength–Tunable Superstructure Grating (SSG) DBR Lasers", IEEE Journal of Quantum Electronics, vol. 29, No. 6, pp. 1817–1823, Jun. 1993.

Electronics Letters, vol. 31, No. 15, pp. 1258–1260, Jul. 20, 1995, C.K. Gardiner, et al., "Wavelength Tuning in Three Section Sampled Grating DBR Lasers".

Proceedings of the International Conference on Indium Phosphide and Related Materials, pp. 33–36, V. Jayarman, et al., "Continuous–Wave Operation of Sampled Grated Tunable Lasers with 10mW Output Power, >60nm Tuning, and Monotonic Tuning Characteristics".

IEE Proceedings—J. vol. 138, No. 2, pp. 171–177, Apr. 1991, Y. Kotaki, et al., "Wavelength Tunable DFB and DBR Lasers for Coherent Optical Fibre Communications".

IEEE Journal of Quantum Electronics, vol. 29, No. 6, pp. 1817–1823, Jun. 1993, Yuichi Tohmori, et al., "Broad–Range Wavelength–Tunable Superstructure Grating (SSG) DBR Lasers".

Electronics Letters, vol. 30, No. 18, pp. 1492–1494, Sep. 1, 1994, V. Jayaraman, et al., "Widely Tunable Continuous–Wave INGaAsP/InP Sampled Grating Lasers".

Appl. Phys. Lett., vol. 60, No. 26, pp. 3209–3211, Jun. 29, 1992, R.C. Alferness, et al., "Broadly Tunable InGaAsP/InP Laser Based on Vertical Coupler Filter with 57–nm Tuning Range".

*Primary Examiner*—Rodney B. Bovernick
*Assistant Examiner*—Luong-Quyen T. Phan
*Attorney, Agent, or Firm*—Oblon, Spivak, McClelland, Maier & Neustadt, P.C.

[57]  ABSTRACT

Sample grating distributed Bragg reflector laser, very widely matchable by phase variation, and a process for using this laser.

This laser comprises an active section (32) and two sample grating sections (34, 36) placed on each side of the active section, respectively, each sample grating section comprising phase parts (48, 52) alternating with grating parts (50, 54), and means (62, 64, 70, 72) of injecting current into the phase parts and into grating parts independently for each sample grating section.

Application to telecommunications by optical fibres.

8 Claims, 5 Drawing Sheets

SAMPLE GRATING DISTRIBUTED BRAGG REFLECTOR LASER, VERY WIDELY MATCHABLE BY PHASE VARIATION AND PROCESS FOR USING THIS LASER

DESCRIPTION

1. Technical Field

This invention relates to a sample grating distributed Bragg reflector laser, and a process for using this laser.

It is a very widely matchable single-frequency laser.

This invention is particularly applicable to the field of telecommunications by optical fibres.

2. State of the Prior Art

Various laser structures have been proposed and made in order to obtain single-frequency lasers with semi-conductors matchable in wavelength.

The distributed Bragg reflector structure enables discontinuous matchability (in steps) over a 10 nm range.

This subject is described in document (1) which, like the other documents referred to in this patent, is included in the references at the end of the present description.

This distributed Bragg reflector structure includes an active section (amplification part) coupled to a passive guiding section on which the Bragg grating (which enables single-frequency transmission) is engraved.

The matchability of this type of laser is obtained by injecting current into the section in which the Bragg grating is located.

The variation in the number of carriers contributes to modifying the reflection index of this section and therefore the Bragg wavelength of the laser.

Documents (2) and (3) describe other structures with more complex gratings or guides, and which can give greater discontinuous matchability (in steps) over a range of the order of 60 to 100 nm.

In particular, documents (4) and (5) describe a sample grating distributed Bragg reflector laser structure which can give discontinuous matching over about 60 nm.

For all these structures, the wavelength matchability is based on the variation of the refraction index by injection of carriers in a guiding section which includes a more or less complex grating.

Figure 1:
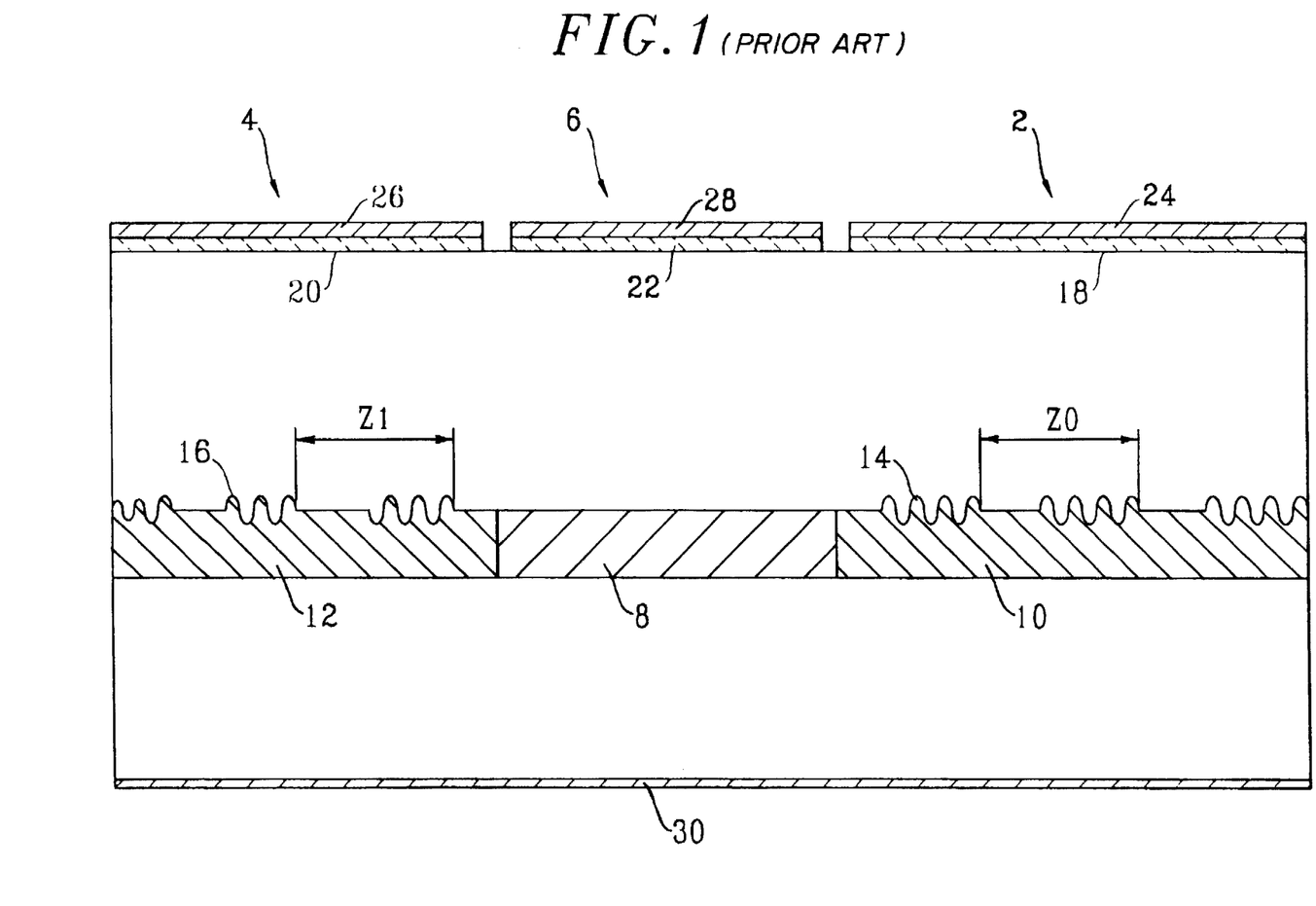
FIG. 1 is a schematic longitudinal sectional view of a known sample grating distributed Bragg reflector laser, that has already been described.

FIG. 1 is a diagrammatic longitudinal sectional view of a known sample grating distributed Bragg reflector laser.

This known laser in FIG. 1 contains a first sample grating section 2, a second sample grating section 4 and an active section 6 placed between sections 2 and 4.

FIG. 1 also shows an active layer 8 that is located in the active section 6, and a guide layer 10 located on each side of this active layer in section 2 and a guide layer 12 located in section 4.

The sample grating 14 in section 2 is formed on the guide layer 10 and the sample grating 16 in section 4 is formed on guide layer 12.

The upper surface of the laser supports contact layers 18, 20 and 22 respectively in sections 2, 4 and 6, these contact layers themselves being fitted with control electrodes, 24, 26 and 28.

On its lower face, the laser in FIG. 1 also comprises an electrode 30 as shown on FIG. 1.

The period of the sample grating in section 2 is denoted Z0, and the period of the sample grating in section 4 is denoted Z1, and this period Z1 is not the same as period Z0.

Figure 2:
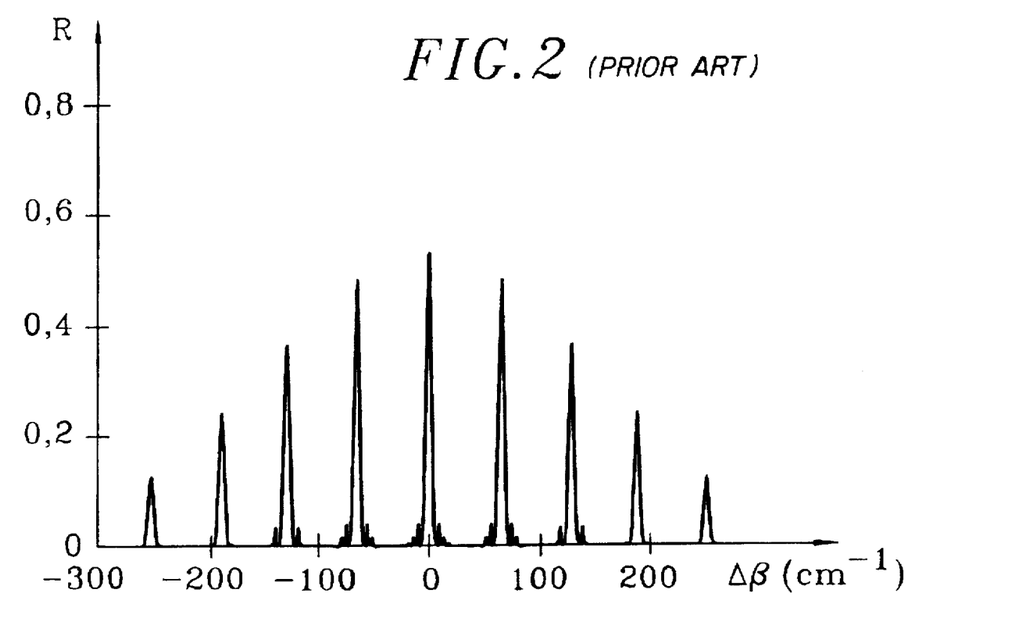
FIGS. 2 and 3 are diagrams showing the power reflectivity for the two laser sample gratings in FIG. 1, and have already been described.

FIG. 2 shows variations of power reflectivity R of the sample grating 14 in section 2 as a function of a parameter $\Delta\beta$ which is expressed in $cm^{-1}$, and the definition of which is given below.

Figure 3:
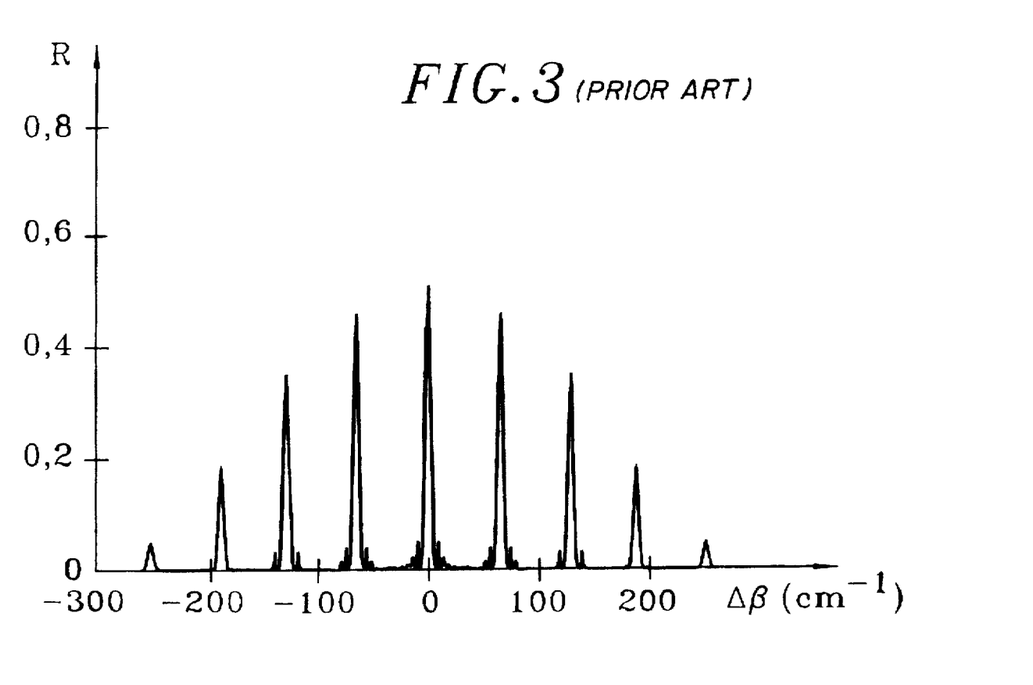

FIG. 3 shows variations of power reflectivity R of the sample grating 16 of section 4, as a function of this parameter $\Delta\beta$ which is a function of the wavelength $\lambda$.

Note that this parameter is given by the following formula:

$$\Delta\beta = 2\pi(1/\lambda - 1/\lambda o)$$

where $\lambda o$ represents the Bragg wavelength of the diffraction grating considered (expressed in cm).

Each graph in FIGS. 2 and 3 is comb-shaped, centered on the Bragg wavelength $\lambda o$ of the corresponding diffraction grating, since $\Delta\beta=0$ if $\lambda=\lambda o$.

The spacing between the peaks in each comb depends on the period of the corresponding sample grating.

In the case in FIG. 2, this spacing $\Delta p0$ is equal to:

$$\Delta p0 = \lambda o^2/(2n_g.Z0).$$

In the case in FIG. 3, this spacing $\Delta p1$ is equal to:

$$\Delta p1 = \lambda o^2/(2n_g.Z1).$$

In the above two formulas, parameter $n_g$ represents the group index.

In the example in FIG. 1, the two combs have different spacings between peaks, but the same Bragg wavelength.

At zero injection in sample grating sections 2 and 4, the laser in FIG. 1 operates at the Bragg wavelength, due to the coincidence at this wavelength of the central peak in each comb, the light not being reflected at other wavelengths.

In order to match this laser in FIG. 1, simply move one of the combs (by injection of an appropriate current into the corresponding section, through the control electrode associated with this section), in order to obtain coincidence between the other two comb peaks at another wavelength.

This matchability is called "coarse matchability", and can only provide access to a small number of different wavelengths (7 channels out of a matching range of 60 nm).

Assuming Z0>Z1, which implies that $\Delta p0$ is less than $\Delta p1$, it is specified that if current is injected into the control electrode corresponding to section 2, then the corresponding comb actually moves towards the shorter wavelengths and coincidence is obtained for peaks located towards wavelengths shorter than $\lambda o$.

On the other hand, if a current is injected into the control electrode in section 4, the corresponding comb moves even further towards the shorter wavelengths, but coincidence is obtained for peaks located towards wavelengths longer than $\lambda o$.

Note that the electrode 28 in the active section 6 is used to inject the current into this section to obtain the laser effect.

A "fine matchability" can be obtained by moving the two combs in FIGS. 2 and 3 together.

In this case, the same peaks must remain coincident throughout the matching.

It is then theoretically possible to cover a discontinuous matchability range of the same order of magnitude as that measured on a distributed Bragg reflector laser, namely about 10 nm.

This limiting value is related to the maximum index variation obtained by injecting current into the material forming the region in which the corresponding grating is located.

Consequently, by coupling the two effects, with fine matchability it is possible in principle to cover the range of wavelengths separating two channels and which is obtained by coarse matchability, and therefore to access a large number of wavelengths within the 60 nm matchability range.

Sample grating distributed Bragg reflector lasers have the following disadvantages:

A first disadvantage is the influence of the variation of losses by absorption in regions containing gratings when a current is injected into them to change the transmission wavelength.

This influence causes a reduction in the efficiency of gratings under injection and when there are large variations in the optical power and the side mode suppression ratio.

A second disadvantage is the complexity of relations between currents injected into the two sample grating sections to obtain fine matchability.

These relations, which are different for each channel obtained by coarse matchability, are not linear.

A third disadvantage is due to the fact that the best possible total accessible matchability is limited by fine matchability (approximately 10 nm) multiplied by the number of channels accessible by coarse matching.

Up to now, the maximum measured fine matchability has been 3 nm.

Refer to document (5) on this subject.

Presentation of the Invention

This invention relates to a sample grating distributed Bragg reflector laser which is very widely matchable and which has none of the disadvantages described above.

In particular, this invention can:

strongly reduce optical power variations and maintain the side mode suppression ratio at a high value throughout the entire range of matching wavelengths of the laser, simplify control of the various currents necessary to match this laser in wavelengths, and finally achieve wavelength matchability better than what can be obtained with a conventional sample grating distributed Bragg reflector laser and have almost continuous access to all wavelengths within the matching range of the laser.

The principle of this invention is the separation of current injection in sample grating sections, between phase parts and parts of the grating that form these sections.

Consequently, it is possible to:

reduce the magnitude of optical losses by absorption under injection, simplify the current control necessary to obtain fine matchability, obtain a very high total matchability range (90 nm), and have almost continuous access to all wavelengths within this range, unlike what has been measured in the case of conventional sample grating distributed Bragg reflector lasers.

Precisely, the object of this invention is a sample grating distributed Bragg reflector laser, this laser comprising an active section and two sample grating sections which are placed on each side of the active section, respectively, each sample grating section comprising phase parts which alternate with grating parts, this laser being characterized in that it also includes current injection means into phase parts for each sample grating section, and independently into grating parts.

According to a preferred embodiment of the laser according to the invention, these current injection means include two electrodes separated from each other and one of which is formed facing all phase parts, and the other facing all grating parts of this sample grating section.

Preferably, these electrodes form combs, the teeth of which are placed above the laser guiding part, the teeth of the electrode associated with all phase parts being placed above these phase parts whereas the teeth of the electrode associated with all grating parts are placed above these grating parts.

This invention also relates to a process for using the laser of the invention, wherein a current is injected into grating parts of at least one of the sample grating sections.

According to a specific embodiment of the process described in the invention, a current is also injected into the phase parts of at least one of the sample grating sections.

BRIEF DESCRIPTION OF THE DRAWINGS

The present invention will be better understood after reading the description of the following example embodiments, given for guidance only and in no way limitative, by referring to the drawings in the appendix in which.

DETAILED PRESENTATION OF SPECIFIC EMBODIMENTS

As already seen above, the principle of the present invention depends on separation of current injection in sample grating sections between the phase parts and grating parts that form these sections, in a sample grating distributed Bragg reflector laser.

Figure 4:
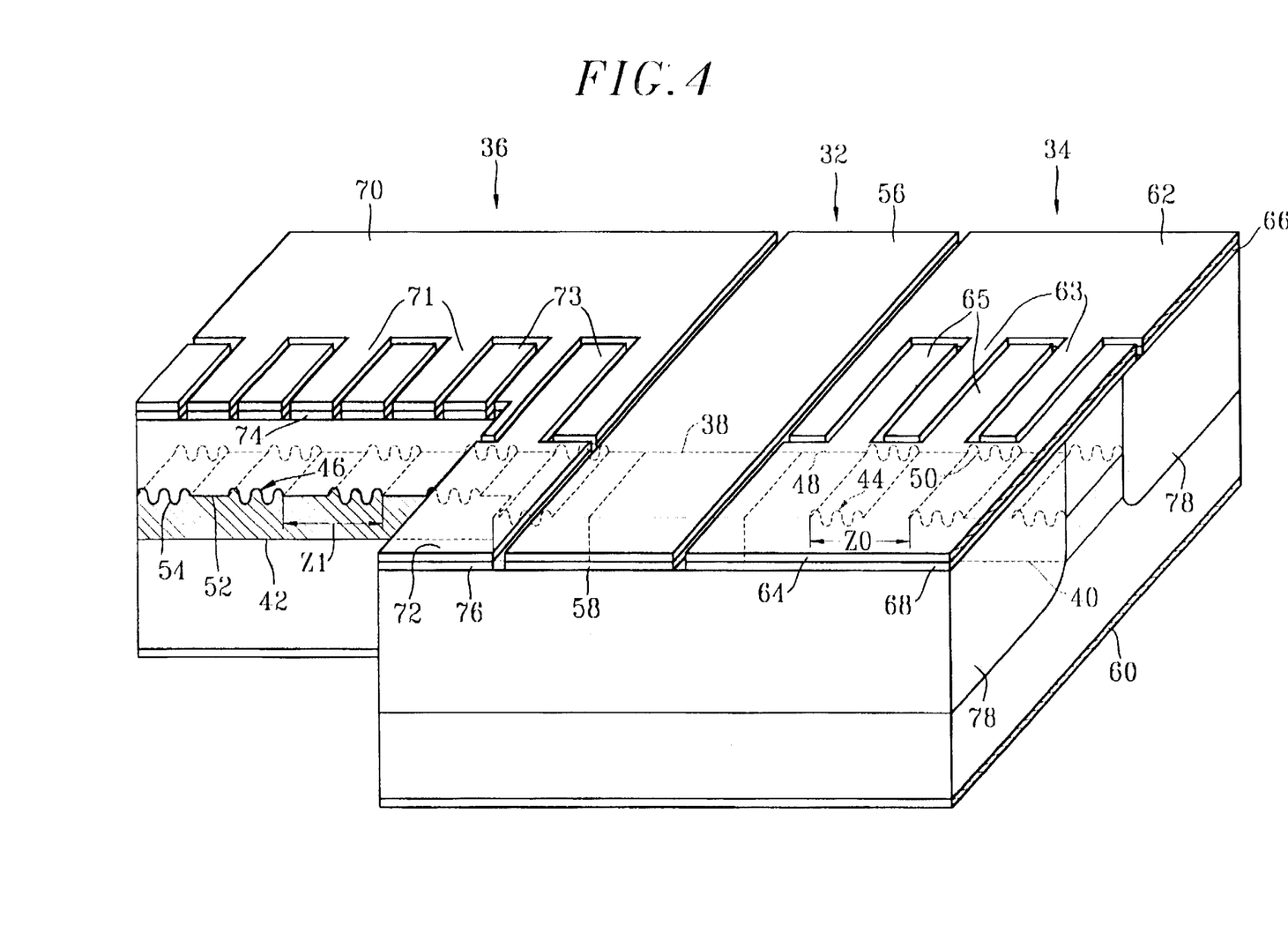
FIG. 4 is a schematic perspective view of a partial section through a specific embodiment of the laser described in this invention, and FIGS. 5A to 5F schematically illustrate different steps in the process for manufacturing a laser in accordance with the invention.

This principle is shown in FIG. 4 which is a schematic perspective view of a partial section through of a laser in accordance with this invention.

The laser in FIG. 4 contains an active section 32 and two sample grating sections 34 and 36, which are placed in a known manner on each side of the active section.

FIG. 4 shows the active layer 38 of the laser on each side of which there is a light guide layer 40 in section 34 and a light guide layer 42 in section 36.

A sample grating 44 is formed in section 34 on guide layer 40.

Another sample grating 46 is formed on guide layer 42 in section 36.

In the sample grating section 34, a distinction can be made between phase parts 48 which are areas of this section without grating and parts of the grating 50, areas in which the grating itself is located and which alternate with phase parts 48.

Similarly, a distinction can be made in the sample grating section 36 between phase parts 52 which are areas without a grating and grating parts 54, areas in which the grating itself is located and which alternate with phase parts 52.

The period of the sample grating in section 34 (in other words the length of a sample grating pattern in this section 34) is denoted Z0, and the period of the grating in section 36 (in other words the length of a pattern of the sample grating in this section 36) is denoted Z1.

It also shows an active section 32 control electrode 56 on the upper surface of the laser, this electrode being formed on a contact layer 58.

There is also an electrode 60 on the lower surface of the laser.

In accordance with the invention, control electrodes in sections 34 and 36 in the laser in FIG. 4 are split into two parts.

More specifically, section 34 is provided with two control electrodes 62 and 64 separated from each other.

Electrode 62 is a phase electrode which is formed opposite all phase parts of section 34.

Electrode 64 is a grating electrode which is formed opposite all parts of the grating in this section 34.

It can be seen that each electrode 62 and 64 is in the shape of a comb, and that the teeth 63 on electrode 62 alternate with the teeth 65 on electrode 64, while remaining separate from them.

The teeth 63 on electrode 62 are located above the phase parts 48, and more precisely above the parts of the guide layer 40 where there is no grating.

The teeth 65 of electrode 64 are located above the parts of grating 50, and more precisely above the parts of the guide layer 40 where the grating itself is located.

On FIG. 4, references 66 and 68 correspond to contact layers separate from each other, and on which comb-shaped electrodes 62 and 64 are formed respectively.

In the same way, section 36 is fitted with two control electrodes 70 and 72 separate from each other.

Electrode 70 is a phase electrode that is formed opposite all phase parts of section 36.

Electrode 72 is a grating electrode that is formed opposite all grating parts of this section 36.

It can be seen that each electrode 70 and 72 is comb shaped, and that the teeth 71 of electrode 70 alternate with the teeth 73 of electrode 72, while remaining separate from them.

The teeth 71 of electrode 70 are located above the phase parts 52, and more precisely above the parts of the guide layer 42 where there is no grating.

The teeth 73 of electrode 72 are located above the parts of grating 54, and more precisely above the parts of the guide layer 42 in which the grating itself is located.

On FIG. 4, references 74 and 76 correspond to contact layers which are separate from each other, and on which comb-shaped electrodes 70 and 72 respectively are formed.

Obviously, electrically insulating areas 78 are formed on each side of the guide layers 40 and 42.

These areas 78 are designed to limit current injection that would be made from electrodes 48, 50, 52 and 54 to these guide layers.

Note that the two ends of FIG. 4 correspond to transverse sections of the laser shown on this figure: in reality, sample gratings of this laser may contain many more periods than are seen on the figure, for example about 10 periods each.

In the case of a laser in accordance with the invention, for example as shown in FIG. 4, it is always possible to make a coarse match of this laser by moving one of the combs of the power reflectivity diagrams associated with sample grating sections 34 and 36 respectively.

In order to move this comb, instead of injecting a current in the corresponding sample grating section, the current is now only injected into the parts of the grating in this sample grating section.

The variation of optical losses by absorption is directly proportional to the length of the section in which the current is injected, and to the variation of carriers which are created directly by this current.

In a sample grating, the contribution of the phase part is predominant, for example this phase part may have a length of 30 μm for part of the grating that only has a length of 3 μm (for example, see document (5)).

In this case, the use of a laser in accordance with the invention instead of a conventional sample grating distributed Bragg reflector laser, makes it possible to reduce by 90% the variation of optical losses under current injection by injecting a current limited to a length of 3 μm instead of 33 μm, and therefore to reduce the influences of these losses.

A laser in accordance with the invention can always be finely matched by moving the combs for the reflectivity diagrams associated with the laser sample grating sections together, but injecting a current into this laser only in the grating parts of these sample grating sections.

The same advantages are observed as in the case of coarse matchability, and the benefit is even greater in this type of matchability.

In the case of fine matchability, currents are injected into the two sample grating sections and therefore in an even higher wavelength.

The fact that the current injection is limited to parts of the grating in each sample grating section can correspondingly reduce the influence of optical losses related to current injection.

Nevertheless, in this use of a laser in accordance with the invention, other disadvantages of the sample grating distributed Bragg reflector laser such as the complexity of controlling matching currents, are not always eliminated.

But an advantage of a laser in accordance with the invention is that it is possible to coarsely or finely match the laser by injecting current into phase parts of sample grating sections.

In this case, current injection into the phase parts of a sample grating section contributes to creating an index variation between these phase parts and the grating parts of this sample grating section, and this variation creates a phase shift $\Delta\Phi$ of the light wave that propagates in the sample grating section.

This phase shift corresponds directly to a shift in the wavelength of the comb in the corresponding reflectivity diagram compared with the Bragg wavelength.

A phase shift $\Delta\Phi$ of $2\pi$ corresponds to a wavelength shift equal to the spacing that separates two peaks in the comb.

It is then easy to measure the advantage of this matchability by phase: the maximum wavelength possible variation using this method does not depend solely on the maximum variation of the accessible index as in the case of a conventional sample grating distributed Bragg reflector laser.

The maximum matchability is obtained for a maximum phase variation of $2\pi$, which gives a maximum matchability that depends directly on the period of the sample grating (Z0 or Z1 on FIG. 4) in the sample grating section in the phase parts in which a current is injected.

For example, in the case of lasers made in the system using InP/InGaAsP materials, the maximum variation in the effective index Δn is approximately equal to $4 \times 10^{-2}$ and ΔΦ is expressed using the following formula:

$$\Delta\Phi = 2\pi\, L_p \Delta n / (\Lambda . n)$$

where $L_p$ is the length of the phase part of the period of the sample grating, Λ is the grating pitch (and for example may be equal to 0.240 μm), and n is the effective index (and for example is equal to 3.25).

In order to obtain a variation of 2π, $L_p$ must be greater than n Λ/Δn, or about 20 μm.

In the case of a period Z0 equal to 30 μm, the spacing between peaks is then 10.8 nm.

In the case of a period Z0 equal to 25 μm, it becomes equal to 13 nm.

It is thus possible to obtain a total matchability of 91 nm by adding the matchability by phase obtained on each of the 7 channels reached by coarse matchability, itself done by injecting current into grating parts of the sample grating sections.

Furthermore, the overriding advantage of a laser in accordance with the invention is that it uses the same relation (linear relation) between currents injected into phase parts of the two sample grating sections, relation which is necessary for fine phase matching of the laser between the channels obtained by coarse matching, regardless of the selected coarse channel.

Controlling currents to match this type of laser then becomes very easy: a current injected into the grating parts of one of the sample grating sections can select one coarse channel among the various accessible channels; two currents are then injected in the phase parts of the two sample grating sections, these currents being related by a linear relation that is independent of the selected channel, to move combs together for the reflectivity diagrams of the two sample grating sections and thus access all wavelengths located between the coarse channels.

On the other hand, in the case of a conventional sample grating distributed Bragg reflector laser, it would be necessary to inject a current into one of the two sample grating sections in order to select any coarse channel.

Then in order to move the combs together, the current has to be injected in the two sample grating sections.

Since the current is already injected into one of the sample grating sections, relations between the currents controlling fine matching are therefore different for each coarse channel, and the available fine matching is different in different coarse channels.

The current used for moving the coarse matching comb has to be subtracted from the current that can be used for moving the fine matching comb.

In order to make a laser in accordance with the invention, simply modify an arbitrary conventional sample grating distributed Bragg reflector laser when making the laser electrodes in order to be able to inject current into each sample grating separately into all phase parts and into all grating parts.

FIG. 4 described above illustrates an example of the possible shape of the electrodes.

A dry engraving by an ion bundle using argon, associated with masking by a photosensitive resin, can be used for the required separation of electrodes.

The following laser structure was modeled to demonstrate the advantages of the invention and to present its characteristics.

In the modeled example, the length of the active area is equal to 600 μm, the length of each phase part of the two sample grating sections is 20 μm and the periods Z0 and Z1 of the sample gratings are equal to 25 μm and 24 μm respectively.

The Bragg wavelength of the grating is equal to 1550 nm.

The spacing between peaks is 13 nm for the 25 μm period and 13.53 nm for the 24 μm period.

Concerning coarse matchability obtained by current injection into sample grating sections, there are seven available modes and the variation in the gain at the threshold is then $30\ cm^{-1}$.

The gain at the threshold indicates the minimum optical amplification to be supplied by the active section of the laser to obtain a stimulated light emission: the current injected into the active section to obtain the corresponding optical amplification increases as this gain at the threshold increases.

Finally, the optical power of the laser fluctuates increasingly as the fluctuation in this gain at the threshold increases when the laser is matched in wavelength: the variation in this optical power as a function of currents directly translates the influence of the variation in the optical losses.

In the case of a current injection limited to grating parts of the sample grating sections, the seven same modes are accessible and the variation in the gain at the threshold is then $20\ cm^{-1}$.

This variation in the gain at the threshold is much weaker with this type of injection limited to grating parts and confirms the advantage of the invention to limit the magnitude of optical losses on matchability of the laser.

Concerning fine matchability related to current injection in phase parts of sample grating sections, a matchability of 13.53 nm is observed with the 24 accessible channels for the first coarse mode selected by a zero current injected in grating parts of the section with period Z0.

For fine matchability related to current injection in phase parts of sample grating sections, matchability for the third coarse mode selected by a current of 1 mA injected in grating parts of the section with period Z0, is also 13.53 nm with 24 accessible channels.

The following is a description of a process for the manufacture of a laser in accordance with the invention, referring to FIGS. 5A to 5F.

Figure 5A:
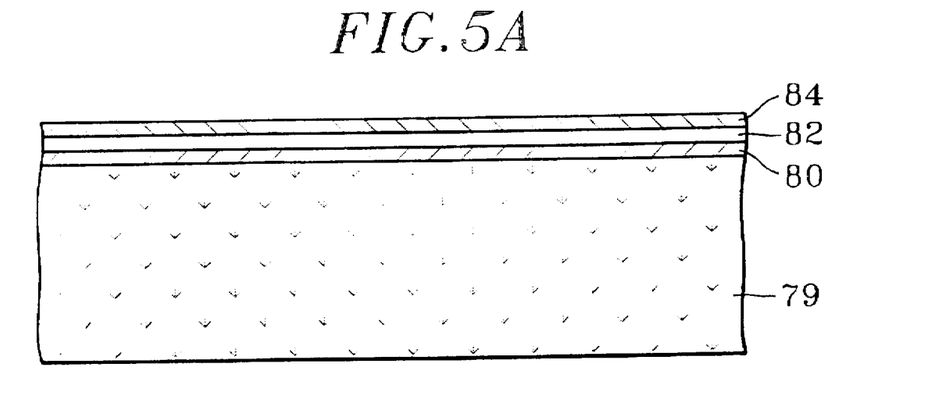

An n+ doped InP substrate 79 is used (FIG. 5A).

The following are deposited by epitaxy on this substrate 79:

an n+ doped InP buffer layer 80, an active layer 82 designed for example to obtain an emission at 1.55 μm, and a p+ doped InP protective layer 84.

Figure 5B:
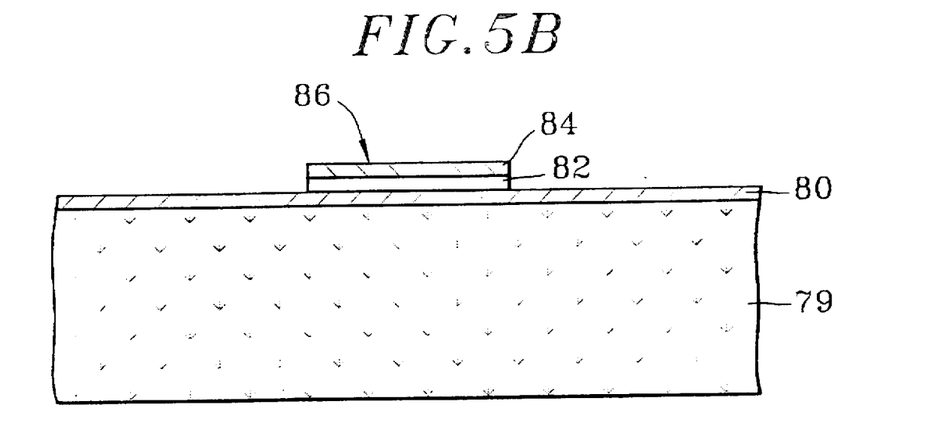

In a second step diagrammatically illustrated by FIG. 5B, the protective layer 84 and the active layer 82 are engraved to delimit the active part 86 of the laser.

Figure 5C:
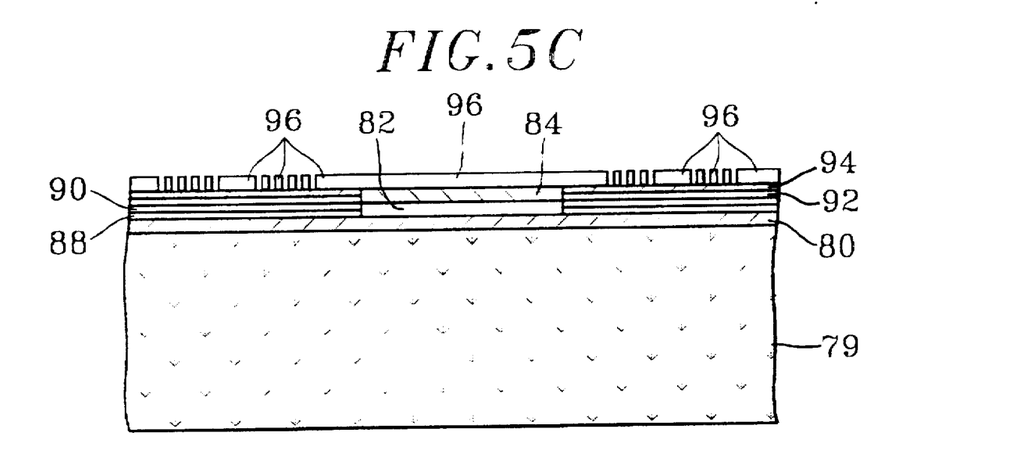

Then, as shown schematically in FIG. 5C, the following layers are grown by selective epitaxy in the parts of the structure obtained other than the active part 86:

a guide-layer 88 transparent at 1.55 μm, for example made of InGaAsP 1.3 μm, an n doped InP layer 90, a layer 92 made of InGaAsP, a p+ doped InP layer 94, the latter three layers 90, 92 and 94 being designed to make the laser diffraction grating.

Figure 5D:
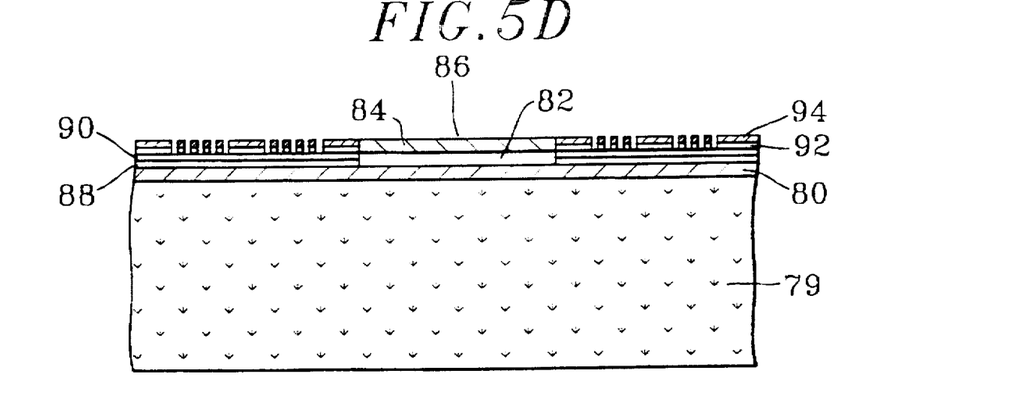

The next step, which is schematically shown in FIG. 5D, consists of engraving the diffraction grating in the parts of the grating of the two laser sample grating sections through an appropriate mask 96 designed to protect areas with no grating, namely the active section, the phase parts of the two sample grating sections and the phase section if any (which does not include the laser which is manufactured as shown in FIGS. 5A to 5F).

The next step consists of engraving the laser ribbon perpendicularly to the lines on the diffraction grating.

Then (FIG. 5E), an epitaxy correction is made in order to submerge the ribbon in a confinement layer 100 made of $p^+$ doped InP, and a contact layer 102 made of $p^+$ doped InGaAs is formed on this layer 100.

Figure 5E:
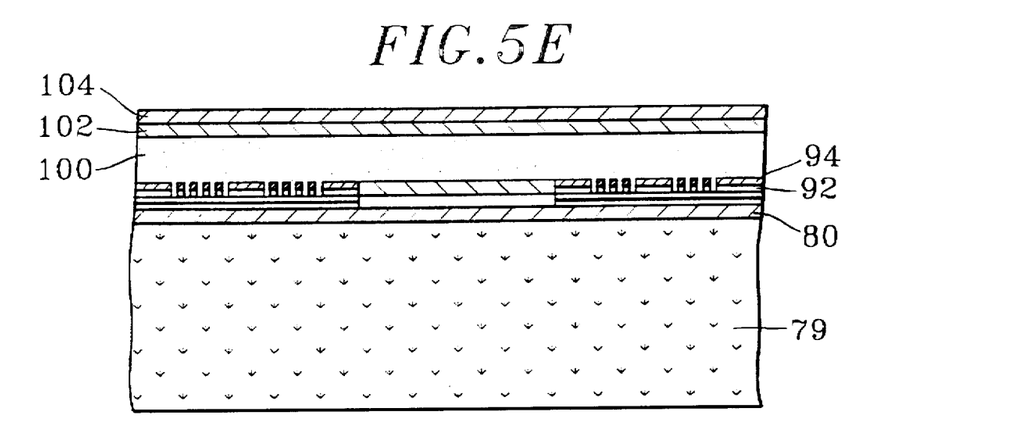

In order to limit current injection to the laser ribbon, protons are implanted in the areas on each side of this ribbon in order to make these areas electrically insulating.

Then, a metal electrode 104 is formed on this layer 102 by successive evaporation of platinum, titanium and gold over the entire surface of the structure obtained.

Figure 5F:
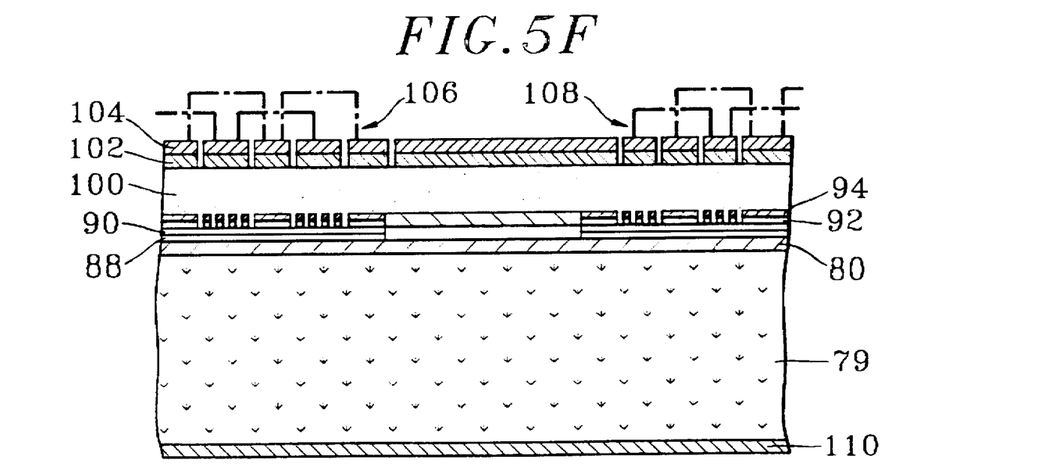

Then, in order to obtain the required contact separation, dry engraving is used by an ion beam using argon, this engraving being associated with an appropriate mask by a photosensitive resin.

This mask delimits not only the active section, but also the phase section and sample grating sections 106 and 108 (FIG. 5F), and also phase parts and grating parts of each sample grating section, by means of a groove engraved in the metal layers, the InGaAs contact layer and partially in the $p^+$ doped InP confinement layer, the depth engraved in the latter layers being of the order of 0.1 µm.

Finally, a lower electrode 110 is formed on the lower surface of substrate 79.

The following documents are mentioned in this description:

(1) Y. KOTAKI et al.: "Wavelength Tunable DFB and DBR Lasers For Coherent Optical Fibre Communications", IEE Proceedings-J, Vol. 138, No. 2, April 1991

(2) Y. TOHMORI et al.: "Broad-range Wavelength Tunable Superstructure Grating (SSG) DBR Lasers", IEE Journal of Quantum Electron., Vol. 29, No. 6, June 1993

(3) R. C. ALFERNESS et al.: "Broadly Tunable InGaAsP/InP Laser Mode Based On Vertical Coupler Filter With 57 nm Tuning Range", Appl. Phys. Letters, vol. 60, No. 26, Jun. 29, 1992

(4) V. JAYARAMAN et al.: "Continuous-wave Operation Of Sample grating Tunable Lasers With 10 mW Output Power, >60 nm Tuning, And Monotonic Tuning Characteristics", Proceedings IPRM' 94, Santa Barbara, USA, Mar. 27–31, paper MC2, pages 33–36

(5) V. JAYARAMAN et al.: "Widely Tunable Continuous-Wave InGaAsP/InP Sample grating Lasers", Electron. Lett., Vol. 30, No. 18, pages 1492–1494, September 1994.

We claim:

1. A sample grating distributed Bragg reflector laser, comprising:

at least one active section;

at least one first sample grating section disposed on a first side of said at least one active section;

at least one second sample grating section disposed on a second side of said at least one active section, wherein each of said at least one first sample grating section and said at least one second sample grating section comprises at least one phase part adjacent to a respective at least one grating part; and means for injecting current into said at least one phase part and independently into said at least one grating part.

2. A laser according to claim 1, wherein each of said at least one first sample grating section and each of said at least one second sample grating section comprises a plurality of phase parts and a plurality of grating parts, and wherein each of said plurality of phase parts alternate with each of said plurality of grating parts.

3. A laser according to claim 1, wherein said means for injecting current, comprises:

a first electrode facing said at least one phase part; and a second electrode facing said at least one grating part.

4. A laser according to claim 3, further comprising:

a guide part for guiding light through said laser;

said first electrode comprises a comb-shaped electrode having first teeth; and said second electrode comprises a comb-shaped electrode having second teeth disposed between said first teeth, wherein said first teeth and said second teeth are placed above said guide part.

5. A sample grating distributed Bragg reflector laser, comprising:

at least one active section;

at least one first sample grating section disposed on a first side of said at least one active section;

at least one second sample grating section disposed on a second side of said at least one active section, wherein each of said at least one first sample grating section and said at least one second grating section comprises at least one phase part adjacent to a respective at least one grating part; and a plurality of electrodes for injecting current into said at least phase part and independently into said at least one grating part.

6. A laser according to claim 5, wherein said plurality of electrodes comprise:

a first electrode facing said at least one phase part for injecting current into said at least one phase part; and a second electrode facing said at least one grating part for injecting current into said at least one grating part.

7. A laser according to claim 6, wherein:

said first electrode comprises a comb-shaped electrode having first teeth; and said second electrode comprises a comb-shaped electrode having second teeth disposed between said first teeth.

8. A laser according to claim 5, wherein said at least one first sample grating section and said at least one second sample grating section includes a guide part for guiding light through said laser.

* * * * *